United States Patent [19]

Chen et al.

[11] Patent Number: 5,368,710
[45] Date of Patent: Nov. 29, 1994

[54] METHOD OF TREATING AN ARTICLE WITH A PLASMA APPARATUS IN WHICH A UNIFORM ELECTRIC FIELD IS INDUCED BY A DIELECTRIC WINDOW

[75] Inventors: Ching-Hwa Chen, Milpitas; David Liu, San Jose; Duc Tran, Saratoga, all of Calif.

[73] Assignee: LAM Research Corporation, Fremont, Calif.

[21] Appl. No.: 38,612

[22] Filed: Mar. 29, 1993

Related U.S. Application Data

[62] Division of Ser. No. 883,201, May 14, 1992, Pat. No. 5,226,967.

[51] Int. Cl.⁵ .............................................. C23C 14/00
[52] U.S. Cl. ........................ 204/192.32; 204/192.35; 204/192.36; 204/192.37; 156/643
[58] Field of Search ................. 204/192.35, 192.36, 204/192.37, 192.32; 156/643

[56] References Cited

U.S. PATENT DOCUMENTS

| | | | |
|---|---|---|---|
| 4,017,404 | 4/1977 | Habeger | 250/531 |
| 4,134,817 | 1/1978 | Bourdon | 204/298 |
| 4,148,705 | 4/1979 | Battey et al. | 204/298 |
| 4,297,162 | 10/1981 | Mundt et al. | 204/298 |
| 4,324,611 | 4/1982 | Vogel et al. | 204/298 |
| 4,376,692 | 3/1983 | Tsukada et al. | 204/298 |
| 4,426,274 | 1/1984 | Ephrath | 204/298 |
| 4,540,466 | 9/1985 | Nishizawa | 156/643 |
| 4,585,920 | 4/1986 | Hoog et al. | 219/121 PR |
| 4,738,761 | 4/1988 | Bobbio et al. | 204/298 |
| 4,785,763 | 11/1988 | Saitoh | 118/723 |
| 4,818,359 | 4/1989 | Jones et al. | 204/298 |
| 4,844,775 | 7/1989 | Keeble | 204/298 |
| 4,871,421 | 10/1989 | Ogle et al. | 204/298 |
| 4,878,995 | 11/1989 | Arikado et al. | 204/298 |
| 4,885,074 | 11/1989 | Susko et al. | 204/298 |
| 4,943,361 | 7/1990 | Kakehi et al. | 204/192.32 |
| 4,948,458 | 8/1990 | Ogle | 204/192.32 |
| 4,950,316 | 8/1990 | Harris | 55/269 |
| 4,999,096 | 3/1991 | Nihei et al. | 204/298.03 |
| 5,015,331 | 5/1991 | Powell | 204/298.34 |
| 5,038,712 | 8/1991 | Fujiyama | 118/723 |
| 5,122,251 | 6/1992 | Campbell et al. | 204/298.06 |
| 5,234,526 | 8/1993 | Chen et al. | 156/345 |

*Primary Examiner*—John Niebling
*Assistant Examiner*—Kishor Mayekar
*Attorney, Agent, or Firm*—Burns, Doane, Swecker & Mathis

[57] ABSTRACT

A method of plasma treating an article in a housing having a chamber in which the article such as a wafer can be treated with plasma. The housing includes at least one inlet port connected to an interior of the chamber through which process gas can be supplied to the chamber. A radiofrequency energy source is arranged to pass radiofrequency energy into the chamber and induce plasma in the interior of the chamber by activating, with an electric field induced by the radiofrequency energy source, process gas supplied to the chamber through the inlet port. A dielectric window having an inner surface thereof forms part of an inner wall of the chamber. Radiofrequency energy passes from the radiofrequency energy source to the interior of the chamber through the dielectric window. The dielectric window has a thickness which varies at different points along the inner surface thereof such that the thickness is largest at a central portion of the dielectric window. The dielectric window is effective to decrease the induced electric field in the interior of the chamber near the central portion of the dielectric window.

13 Claims, 3 Drawing Sheets

METHOD OF TREATING AN ARTICLE WITH A PLASMA APPARATUS IN WHICH A UNIFORM ELECTRIC FIELD IS INDUCED BY A DIELECTRIC WINDOW

This application is a divisional of application Ser. No. 07/883,201, filed May 14, 1992 now U.S. Pat. No. 5,226,967.

BACKGROUND OF THE INVENTION

The invention relates to apparatuses for processing of substrates using radiofrequency induced plasma in a plasma chamber. In particular, the invention provides apparatuses and methods for generating a plasma of a uniform plasma density.

Gaseous plasma technology is a well known technique used for the fabrication of integrated circuits. Parallel plate reactors have been used extensively for exciting the gases in the reaction chamber to generate the chemical reactions required for thin film etching and deposition of wafers. In general, when coupling power through an insulator, previous hardware setups have used 13.56 MHz as the exciting frequency for the gases due to a higher excitation efficiency. For instance, see U.S. Pat. No. 4,948,458 ("Ogle"), the disclosure of which is hereby incorporated by reference.

In apparatuses such as that shown by Ogle, a radiofrequency magnetic field is induced in a low pressure reaction chamber by sending a radiofrequency resonant current through an external planar coil and passing the generated radiofrequency energy through a dielectric window in the chamber. The magnetic field generates a plasma by causing a circulating flux of electrons in a process gas introduced into the chamber to produce a region of ionic and radical species. The plasma so generated is used to etch or deposit materials on a wafer in the chamber.

It has been found that the plasma density across the surface area of the wafer is highly variable in such apparatuses, with densities measured across 150 mm and 200 mm wafer areas being as much as two times as great in some areas than in others. This non-uniform plasma density causes significantly non-uniform oxide and resist etch rates over measured wafer areas and makes it extremely difficult to control critical dimensions of fine line geometry on the wafer.

Normally, a flat dielectric window is used with the apparatuses. It has been observed that the magnetic flux of the planar coil is highest near the window center and, with a flat window, the induced electric field is consequently higher near the window center. The apparatuses and methods of the present invention utilize a dielectric window having a characteristic cross section, wherein the window is thicker at the center and thinner at the edges, to decrease the higher induced electric field near the window center.

SUMMARY OF THE INVENTION

An apparatus according to one aspect of the present invention includes a housing having a chamber in which a semiconductor wafer can be treated with plasma, the housing including at least one inlet port connected to an interior of the chamber through which process gas can be supplied to the chamber. The apparatus further includes a radiofrequency energy source that is arranged so as to pass radiofrequency energy into the chamber and induce plasma in the interior of the chamber by activating, with an electric field induced by the radiofrequency energy source, process gas supplied to the chamber through the inlet port. A dielectric window having an inner surface thereof forming part of an inner wall of the chamber is arranged such that radiofrequency energy from the radiofrequency energy source can be passed to the interior of the chamber through the dielectric window. The dielectric window has a thickness which varies at different points along the inner surface thereof such that the thickness is largest at a central portion of the dielectric window, the dielectric window being effective to decrease the induced electric field in the interior of the chamber near the central portion of the dielectric window.

The radiofrequency energy source can comprise a substantially planar plasma generating electrode having one planar face thereof facing an outer planar surface of the dielectric window. The dielectric window can be circular in shape. The dielectric window can comprise a plurality of layers of the same or different dielectric materials. The dielectric window can also include at least one step therein such that the dielectric window has a region of reduced thickness surrounding the central portion. The dielectric window can include at least one tapered surface surrounding the central portion or the dielectric window can be convex in shape.

The invention also provides a method for treating an article with plasma comprising steps of placing an article within a chamber and introducing process gas into the chamber and generating a uniform electric field in the chamber by passing radiofrequency energy through a dielectric window in the chamber. The dielectric window has a thickness which varies at different points along an inner surface thereof such that the thickness is largest at a central portion of the dielectric window. As a result, the uniform electric field generates a uniform electron flow in the process gas and thereby generates a plasma of uniform plasma density. The process further includes the step of plasma treating an article by exposing a surface of the article to the plasma generated in the chamber.

BRIEF DESCRIPTION OF THE DRAWINGS

The features and advantages of the present invention will be well understood by reading the following detailed description in conjunction with the drawings in which like numerals indicate similar elements and in which.

DETAILED DESCRIPTION OF THE PREFERRED EMBODIMENTS

Figure 1:
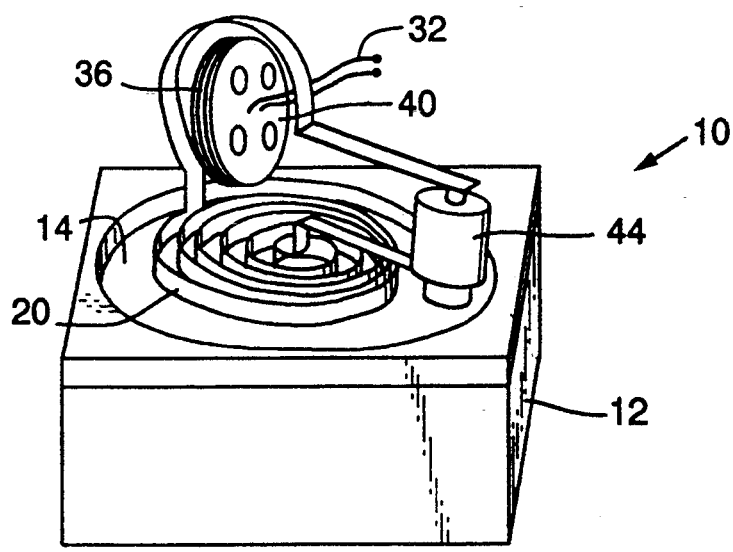
FIG. 1 is an isometric view of an apparatus for producing a planar plasma in accordance with the present invention.

According to the present invention, apparatus and methods are provided for producing highly uniform, planar plasmas over relatively large areas. The ionic and radical species produced in the plasma experience minimum acceleration in non-planar directions, and the resulting plasma thus has very low desired kinetic energy. In addition, uniform planar plasma can be produced over very wide pressure ranges, typically from $10^{-5}$ Torr to 5 Torr, and greater.

The apparatus of the present invention comprises a housing having an interior chamber bounded at least in part by a dielectric window. A planar coil is disposed proximate the window, and a radiofrequency source is coupled to the coil. Usually, the radiofrequency source is coupled through an impedance matching circuit to maximize power transfer and a tuning circuit to provide for resonance at the operating frequency, typically 13.56 MHz. Inlet ports are provided for supplying a process gas to the chamber. By resonating a radiofrequency current through the coil, an electromagnetic field is induced which extends into the chamber through the dielectric window. In this way, a flow of electrons may be induced. Moreover, as the electrons are closely confined to a planar parallel to the planar coil, transfer of kinetic energy in non-planar directions is minimized.

The chamber includes a support surface for a planar article, typically a semiconductor wafer. The surface supports the wafer in a plane which is parallel to the plane of the coil, and hence, also parallel to the plane of the plasma. Thus, the semiconductor wafer is exposed to a uniform plasma flux, ensuring uniform plasma treatment. As the plasma species have minimum kinetic velocities in non-planar directions, their kinetic impact on the wafer is minimized. Thus, the treatment can be generally limited to the chemical interaction of the plasma species with the wafer.

A velocity component in the direction normal to the surface of the semiconductor wafer may be provided by applying a radiofrequency potential in a direction normal to the plane of the plasma. Conveniently, such a potential may be applied by the support surface upon which the wafer is maintained. For instance, the support surface can include a conventional bottom electrode for supplying such a potential.

The method and apparatus of the present invention are useful in a variety of semiconductor processing operations, including plasma etching such as etching of an aluminum layer on a semiconductor substrate, deposition processes, resist stripping, plasma enhanced chemical vapor depositions, and the like.

The housing defines a generally air-tight interior chamber wherein the planar plasma is to be generated. The housing includes at least one inlet port for introducing a process gas and at least one outlet port for connection to a vacuum system for maintaining a desired operation pressure within the chamber. Systems for supplying a preselected process gas and for maintaining a preselected pressure within the chamber are well known in the art and need not be described further. One or more surfaces within the chamber support the articles to be treated. Typically, the surfaces will be disposed in a preselected orientation relative to the planar plasma which is to be generated within the chamber, usually being generally parallel to the plane of the plasma.

In order to induce the desired planar plasma, an electrically-conductive coil is disposed adjacent to the exterior of the dielectric window. The coil is substantially planar and generally comprises a single conductive element formed into a planar spiral or a series of concentric rings. By inducing a radiofrequency current within the coil, an electromagnetic field is produced which will induce a flow of electrons within a planar region parallel to the plane of the coil.

The planar coil is generally circular, although ellipsoidal patterns and other deviations from true circularity can be tolerated. Moreover, the coil may be truly planar across its diameter, or may deviate somewhat from true planarity. Deviations from planarity can be less than 0.2 of the diameter of the coil, usually being less than 0.1 of the diameter. Adjustments to the profile of the coil may be made to modify the shape of the field which is generated. The diameter of the coil will generally correspond to the size of the plasma which is to be generated. Coil diameters may range from about 8 cm to 30 cm, usually from about 13 cm to 18 cm. For the treatment of individual semiconductor wafers, the coil diameter will generally be from about 13 to 18 cm.

The coil includes a sufficient number of turns in order to produce a relatively uniform magnetic field across its entire diameter. The number of turns will also depend on the diameter of the coil. A coil sized for treating individual semiconductor wafers usually has from abut 5 to 8 turns. The resulting inductance of the coil will usually be from 1.2 to 3.5 $\mu$H, with an impedance in the range from about 20 to 300 Ohms.

Conveniently, the planar coil may be formed from any electrically conductive metals, usually being formed from copper. The coil can have a load carrying capacity in the range from abut 5 to 100 amps.

The planar coil is disposed next to a dielectric window forming part of the treatment chamber. The dielectric window maintains the isolation of the interior of the chamber, while allowing penetration of the magnetic field produced by the planar coil. The remainder of the housing can be metal. The dielectric window can be composed of quartz, although other dielectric materials, particularly ceramics which do not absorb energy at the frequency of operation, may be used. Conveniently, a dielectric window may be placed adjacent to a port formed in a wall of the housing. The geometry of the port usually corresponds to that of the planar coil, typically being circular. The planar coil can be disposed very close to or touching the dielectric window in order to maximize the intensity of the magnetic field produced within the chamber. The thickness of the dielectric window is thin enough to transmit the energy to the plasma, usually being selected to be sufficient to withstand the differential pressure created by the vacuum within the chamber. For example, the window can be at least one-half inch thick or thicker.

The planar coil is driven by a radiofrequency (RF) generator of a type which is generally utilized in the operation of semiconductor processing equipment. The RF generator will usually operate at a frequency in the range from about 13.56 MHz to 100 MHz, typically being operated at 13.56 MHz. The RF generator usually has a low impedance, typically about 50 Ohms, and will be capable of producing from about 1 to 6 amps, usually from about 2 to 3.5 amps, with an RMS voltage of at least about 50 volts, usually being at least about 70 volts, or more. Conveniently, the RF generator can have an output connector in the form of a coaxial cable which may be connected directly to the circuitry operating the planar coil.

Figure 2:
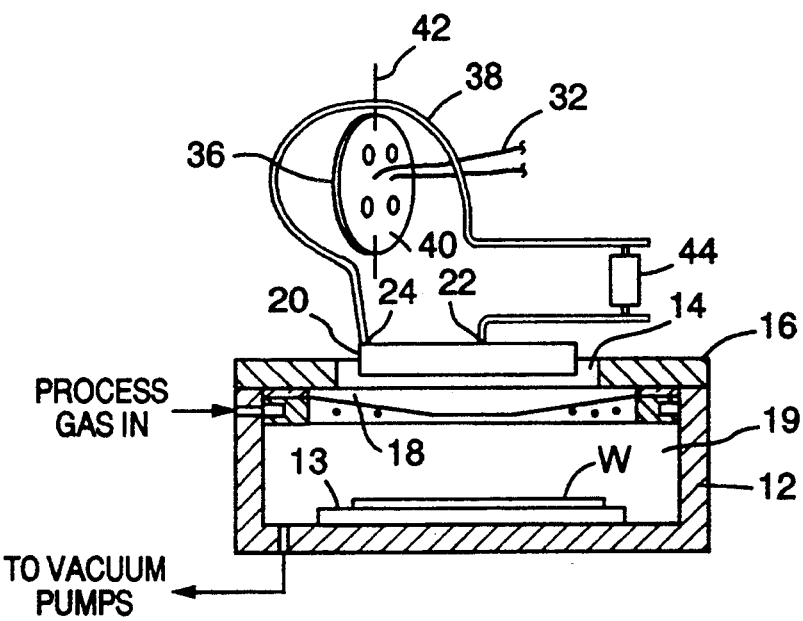
FIG. 2 is a cross-sectional view of the apparatus of FIG. 1.

Referring to FIGS. 1 and 2, a plasma treatment system 10 suitable for etching individual semiconductor wafers W includes a chamber 12 having an access port 14 formed in an upper wall 16. A dielectric shield/window 18 is disposed below the upper wall 16 and extends across the access port 14. The dielectric window 18 is sealed to the wall 16 to define a vacuum-tight interior chamber 19 of the chamber 12.

A planar coil 20 is disposed within the access port 14 adjacent to dielectric window 18. Coil 20 is formed as a spiral having a center tap 22 and an outer tap 24. The plane of the coil 20 is oriented parallel to both the dielectric window 18 and a support surface 13 upon which the wafer W is mounted. In this way, the coil 20 is able to produce a planar plasma within the chamber 19 of the chamber 12 which is parallel to the wafer W. The distance between the coil 20 and the support surface 13 can be in the range from about 3 to 15 cm, more usually from about 5 to 20 cm with the exact distance depending on the particular application.

Figure 3:
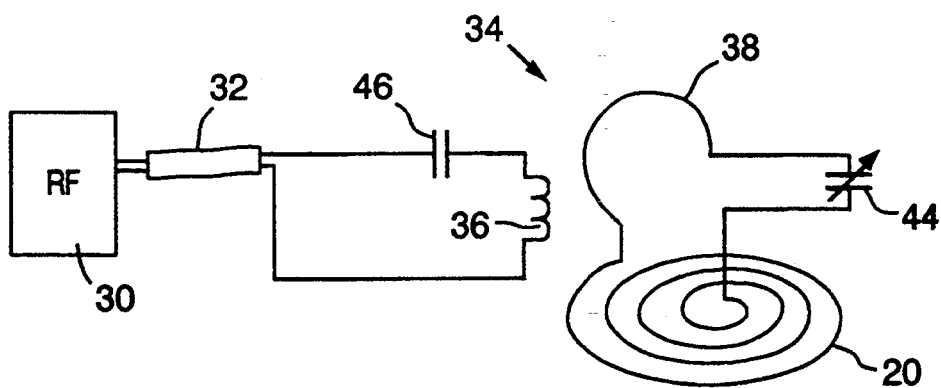
FIG. 3 is a schematic view of the circuitry of the apparatus in FIG. 1.

Referring now to FIGS. 1-3, the planar coil 20 is driven by an RF generator 30 of the type described above. The output of the generator 30 is fed by a coaxial cable 32 to a matching circuit 34. The matching circuit 34 includes a primary coil 36 and a secondary loop 38 which may be mutually positioned to adjust the effective coupling of the circuit and allow for loading of the circuit at the frequency of operation. Conveniently, the primary coil 36 is mounted on a disk 40 which may be rotated about a vertical axis 42 in order to adjust the coupling.

A variable capacitor 44 is also provided in series with the secondary loop 38 in order to adjust the circuit resonant frequency with the frequency output of the RF generator 30. Impedance matching maximizes the efficiency of power transfer to the planar coil 20. An additional variable capacitor 46 can be provided in the primary circuit in order to cancel part of the inductive reactance of coil 36 in the circuit. However, other circuit designs may also be provided for resonantly tuning the operation of planar coil 20 and for matching the impedance of the coil circuit with the RF generator.

Figure 5:
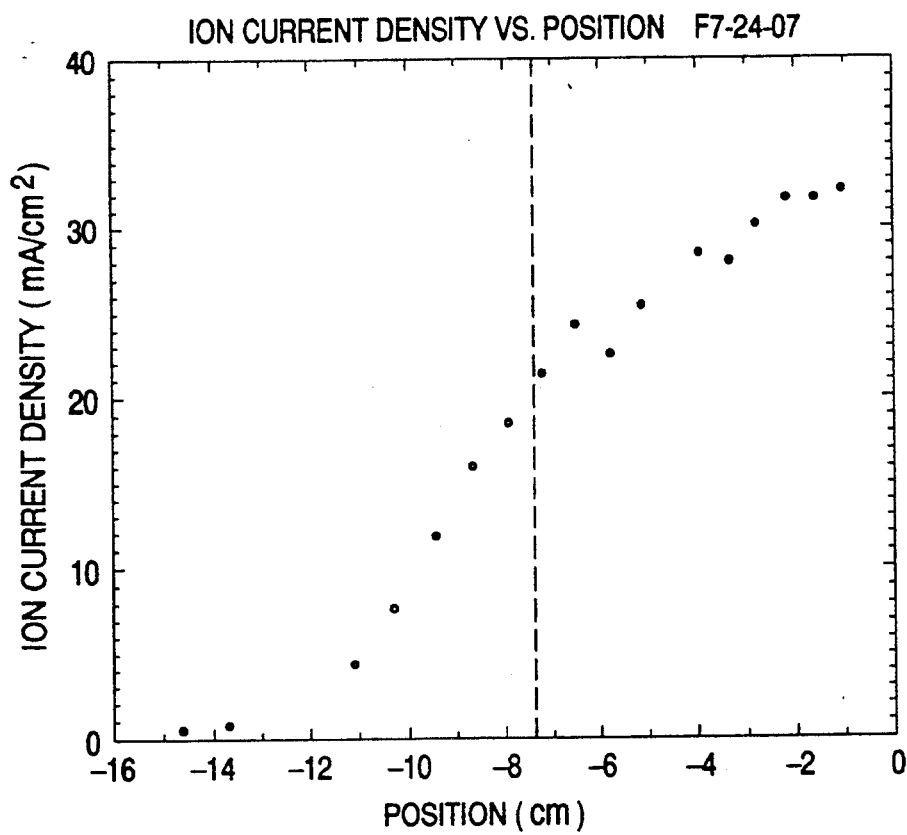
FIG. 5 is a graphic representation of ion current density versus distance from a center of a wafer in an apparatus having a dielectric window with a flat cross-section.
Figure 4:
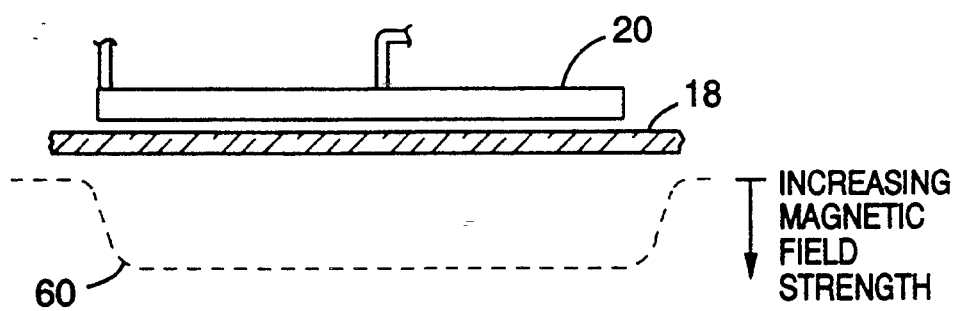
FIG. 4 is a schematic view illustrating the magnetic field profile produced by the apparatus of FIG. 1.

FIG. 4 shows a desired magnetic field profile 60 in a conventional apparatus using a flat dielectric window 18 and a planar coil 20. At the edges of the coil 20, the magnetic field strength is less than at the center. The induced magnetic field causes a circulating flux of electrons in the plasma created by collision of the electrons with the individual molecules of the process gas, and in turn produces a region of ionic and radical species. FIG. 5, however, shows that, with such an apparatus having a window of uniform thickness, ion current density drops off sharply as ion current density is measured farther and farther from the center position 0 of the window 18. The dotted line in FIG. 5 corresponds to the outer edge of a 6 inch wafer.

If the wafer W is small enough, then the reduced ion current density at extreme edges should not adversely affect oxide and resist etch rates on the wafer W. However, it is common to use wafers W having sufficiently large diameters that the reduced ion current density at distances from the center of the coil 20 and window 18 does adversely affect oxide and resist etch rates on the wafer W.

Figure 6:
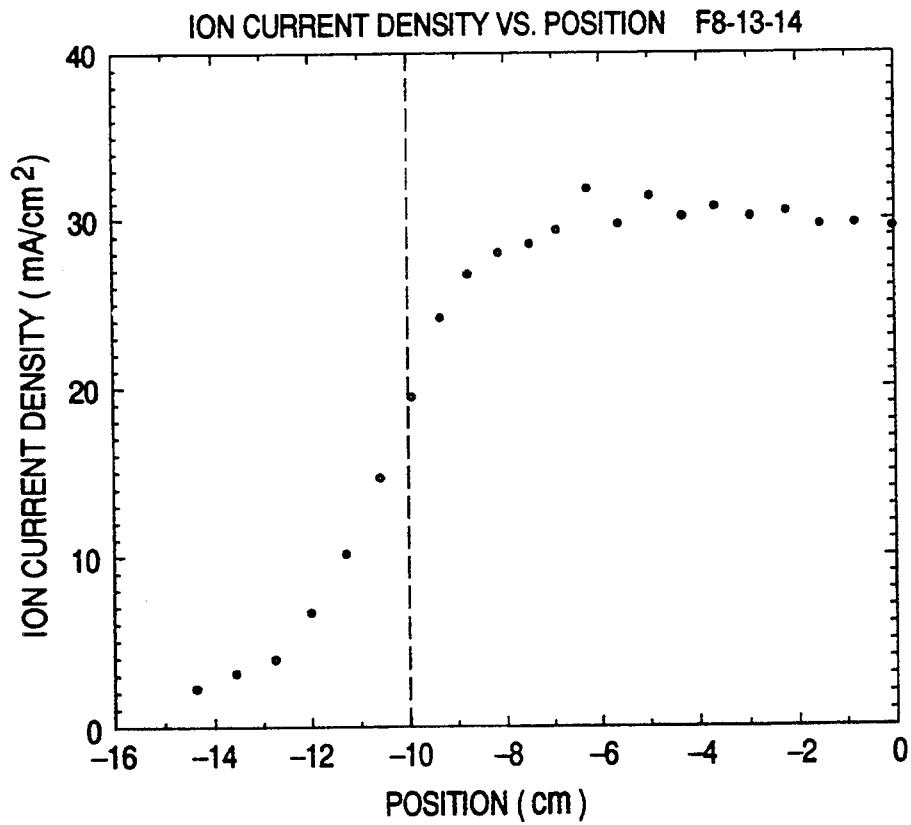
FIG. 6 is a graphic representation of ion current density versus distance from a center of a wafer in an apparatus according to the present invention.

Substantially uniform ion current density, usually within ±5% over the entire diameter of 150 mm and 200 mm diameter wafers, as shown by the graph of test results set out in FIG. 6, is made possible by the present invention by providing a window 18 having a thickened center portion. In particular, the ion current density is substantially uniform from center position 0 to distances of at least 750 mm from the center position 0. The dotted line in FIG. 6 corresponds to an edge of an 8 inch wafer.

Figure 7:
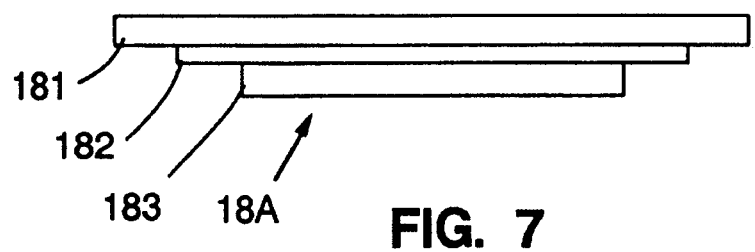
FIG. 7 is a side view of an embodiment of a dielectric window according to the present invention.
Figure 8:
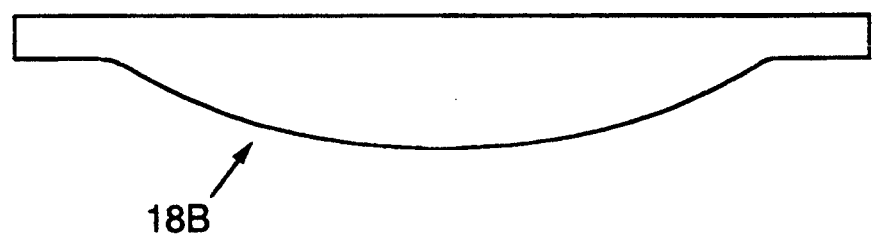
FIG. 8 is a side view of another embodiment of a dielectric window according to the present invention.
Figure 9:
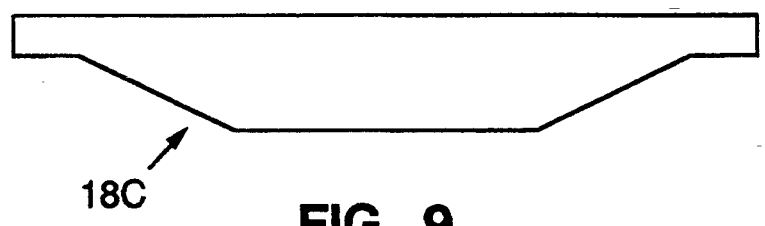
FIG. 9 is a side view of a further embodiment of a dielectric window according to the present invention.

As is shown in FIGS. 7-9, the window 18 according to the invention can have various cross sections. Several different types of window material may be used for the dielectric window 18, including ceramic, quartz or glass materials. The most advantageous window cross section under the particular intended use conditions will be a function of the dielectric constant of the particular window material that is chosen and power supplied to the coil. For instance, in the case where 500 Watts is supplied to the coil, the ratio ($t_c/t_e$) of center thickness $t_c$ to edge thickness $t_e$ is about 3:1. If the power is increased to 1000 Watts, the ratio $t_c/t_e$ is preferably about 1.5:1. On the other hand, if the power is lowered to 200 Watts, the ratio $t_c/t_e$ is preferably about 6:1.

The window 18 having a thickened center may be formed by machining or molding a particular dielectric material such as $Al_2O_3$, $ZrO_2$, $SiO_2$, etc. to form a particular lens cross section. For instance, window 18 can be formed by laminating (such as by sintering) together a series of progressively smaller window portions 181, 182, 183 which form a series of steps, as shown in FIG. 7. In FIG. 7, portions 181 and 183 are one-half inch in thickness and portion 182 is one-quarter inch in thickness. The progressively smaller window portions 181, 182, 183 may, of course, also be machined or molded from a single piece of dielectric material. Alternatively, window 18b can have the convex cross section shown in FIG. 8 or the truncated cone cross section of the window 18c shown in FIG. 9. In FIG. 9, window 18c includes a tapered surface surrounding a thicker central portion of the window. The window 18 can also be made by laminating together materials having different dielectric properties, such as ceramic materials laminated together preferably without adhesive.

According to a preferred embodiment of the invention, dielectric window 18 comprises a flat disc of $Al_2O_3$ having a diameter of 9 to 10 inches. Such a window can be held by suitable seal means in a 12 inch diameter opening in a plasma chamber. The thickened central portion of the window is preferably formed by a flat disc of $Al_2O_3$ having a diameter of about 5 to 6 inches. The two pieces of $Al_2O_3$ can be laminated together by sintering and the ratio of diameters of the two discs can be about 2:1. If the coil is supplied with 500 Watts, the thickness $t_e$ at the outer edge of the window is preferably 1.0 inch and the thickness $t_c$ of the center of the window is preferably 1.5 inch.

The thickened central portion of the window 18 is ordinarily disposed on the inside of the chamber 12, with a flat outer surface of the window 18 facing outwardly from the chamber. Nonetheless, different characteristic cross sections, configurations, materials, and window thicknesses may be found to be more efficacious for particular applications.

It is, of course, possible to embody the invention in specific forms other than those described above without departing from the spirit of the present invention. The embodiments described above are merely illustrative and should not be considered to be restrictive in any way. The scope of the invention is given in the appended claims, rather than the preceding description, and all variations and equivalents which fall within the range of the claims are intended to be embraced therein.

What is claimed is:

1. A method for treating an article with plasma comprising the steps of:

placing an article within an interior of a chamber;

introducing a process gas into the chamber;

generating a uniform electric field in the chamber by passing radiofrequency energy through a dielectric window in the chamber and inducing an electric field in the interior of the chamber, the dielectric window having a configuration which reduces the induced electric field in the interior of the chamber near a central portion of the dielectric window, the uniform electric field generating a uniform electron flow in the process gas and thereby generating a plasma of uniform plasma density; and plasma treating the article by exposing a surface of the article to the plasma generated in the chamber.

2. The method of claim 1, wherein the article comprises a semiconductor substrate and the plasma treating step comprises etching of an aluminum layer on the semiconductor substrate.

3. The method of claim 1, wherein ion current density across the article in the chamber varies by no more than 5% across an area of at least 150 mm in diameter.

4. The method of claim 1, wherein the plasma treating step comprises etching an oxide on a semiconductor wafer.

5. The method of claim 1, wherein the plasma treating step comprises stripping a resist on a semiconductor wafer.

6. The method of claim 1, wherein the plasma treating step comprises deposition of a layer on a semiconductor wafer.

7. The method of claim 1, wherein the window comprises a single piece of quartz.

8. The method of claim 1, wherein the window comprises a plurality of layers of different dielectric materials.

9. The method of claim 1, wherein the window is thickest at the central portion thereof.

10. The method of claim 1, wherein the window includes a flat outer surface.

11. The method of claim 1, wherein the window is substantially circular in shape.

12. The method of claim 1, wherein the window includes a region of reduced thickness surrounding the central portion.

13. The method of claim 1, wherein the window is convex in shape.

* * * * *

UNITED STATES PATENT AND TRADEMARK OFFICE
CERTIFICATE OF CORRECTION

PATENT NO. : 5,368,710
DATED : November 29, 1994
INVENTOR(S) : Ching-Hwa CHEN et al.

It is certified that error appears in the above-indentified patent and that said Letters Patent is hereby corrected as shown below:

Column 8, line 13, delete "deposition" and insert --depositing--.

Signed and Sealed this

Eighteenth Day of April, 1995

Attest:

BRUCE LEHMAN

Attesting Officer

*Commissioner of Patents and Trademarks*